US010465282B2

(12) United States Patent
Rudolph et al.

(10) Patent No.: US 10,465,282 B2
(45) Date of Patent: Nov. 5, 2019

(54) SYSTEMS FOR MODIFYING PRESSURE DIFFERENTIAL IN A CHEMICAL VAPOR PROCESS

(71) Applicant: GOODRICH CORPORATION, Charlotte, NC (US)

(72) Inventors: James Warren Rudolph, Colorado Springs, CO (US); Ying She, East Hartford, CT (US); Zissis A. Dardas, Worcester, MA (US); Thomas P. Filburn, Granby, CT (US); Brian St. Rock, Andover, CT (US); John Linck, Pueblo, CO (US)

(73) Assignee: GOODRICH CORPORATION, Charlotte, NC (US)

( * ) Notice: Subject to any disclaimer, the term of this patent is extended or adjusted under 35 U.S.C. 154(b) by 0 days.

(21) Appl. No.: 15/941,570

(22) Filed: Mar. 30, 2018

(65) Prior Publication Data

US 2018/0223423 A1    Aug. 9, 2018

Related U.S. Application Data

(62) Division of application No. 15/056,358, filed on Feb. 29, 2016, now Pat. No. 9,963,779.

(51) Int. Cl.
  *C23C 16/04* (2006.01)
  *C23C 16/455* (2006.01)
  *C04B 35/83* (2006.01)
  *C23C 16/52* (2006.01)

(52) U.S. Cl.
  CPC ............ *C23C 16/045* (2013.01); *C04B 35/83* (2013.01); *C23C 16/45523* (2013.01); *C23C 16/52* (2013.01); *C04B 2235/77* (2013.01)

(58) Field of Classification Search
  CPC . C23C 16/045; C23C 16/52; C23C 16/45523; C04B 35/83; C04B 2235/77
  See application file for complete search history.

(56) References Cited

U.S. PATENT DOCUMENTS

| 4,139,355 | A | 2/1979 | Turner |
| 5,035,921 | A | 7/1991 | Berneburg |
| 5,262,198 | A | 11/1993 | Liu et al. |
| 5,547,717 | A | 8/1996 | Scaringella |
| 5,853,485 | A | 12/1998 | Rudolph |

(Continued)

FOREIGN PATENT DOCUMENTS

DE    1281224    10/1968

OTHER PUBLICATIONS

Rellick, Gerald, "Densification Efficiency of Carbon-Carbon Composites". Carbon, vol. 28, No. 4, pp. 589-594, 1990.

(Continued)

*Primary Examiner* — Aiden Lee
(74) *Attorney, Agent, or Firm* — Snell & Wilmer, L.L.P.

(57) ABSTRACT

A process for densifying an annular porous structure comprising flowing a reactant gas into an inner diameter (ID) volume and through an ID surface of the annular porous structure, flowing the reactant gas through an outer diameter (OD) surface of the annular porous structure and into an OD volume, flowing the reactant gas from the OD volume through the OD surface of the annular porous structure, and flowing the reactant gas through an ID surface of the annular porous structure and into the ID volume.

3 Claims, 6 Drawing Sheets

(56) References Cited

U.S. PATENT DOCUMENTS

| | | | |
|---|---|---|---|
| 5,904,957 | A | 5/1999 | Christin et al. |
| 6,045,617 | A * | 4/2000 | Keller ............... C23C 16/45523 |
| | | | 118/707 |
| 6,083,560 | A | 7/2000 | Fisher et al. |
| 6,109,209 | A | 8/2000 | Rudolph et al. |
| 6,197,374 | B1 | 3/2001 | Huttinger et al. |
| 6,780,462 | B2 | 8/2004 | Purdy et al. |
| 6,846,514 | B2 | 1/2005 | Jonnalagadda et al. |
| 7,182,980 | B2 | 2/2007 | Goujard et al. |
| 7,335,397 | B2 | 2/2008 | Rudolph et al. |
| 7,437,944 | B2 | 10/2008 | Melcer et al. |
| 7,892,646 | B1 | 2/2011 | Rudolph et al. |
| 7,959,973 | B2 | 6/2011 | Waghray et al. |
| 8,491,963 | B2 | 7/2013 | Lamouroux et al. |
| 8,880,210 | B2 | 11/2014 | Porthouse et al. |
| 2003/0035893 | A1 | 2/2003 | Daws et al. |
| 2004/0071877 | A1* | 4/2004 | Goujard ............... C04B 41/4531 |
| | | | 427/255.28 |
| 2005/0178327 | A1 | 8/2005 | Rudolph |
| 2006/0046059 | A1 | 3/2006 | Arico |
| 2006/0269665 | A1 | 11/2006 | Rudolph |
| 2007/0110985 | A1 | 5/2007 | Miller |
| 2007/0227783 | A1 | 10/2007 | Rudolph |
| 2008/0152803 | A1* | 6/2008 | Lamouroux ............ C23C 16/045 |
| | | | 427/248.1 |
| 2008/0170982 | A1 | 7/2008 | Zhang |
| 2015/0031522 | A1 | 1/2015 | La Forest |

OTHER PUBLICATIONS

Golecki, I., et al., "Rapid densification of porous carbon-carbon composites by thermal-gradient chemical vapor infiltration". Appl. Phys. Lett. 66 (18), May 1, 1995, pp. 2334-2336.

Manocha, Lalit M., et al., "High performance carbon-carbon composites". Sadhana, vol. 28, Parts 1 &2, Feb./Apr. 2003, pp. 349-358.

Tolbin, A. Yu., et al., "Pyrolytic Densification of Porous Carbon-Carbon Composite Materials". Inorganic Materials, 2013, vol. 49, No. 1, pp. 49-56.

Extended European Search Report dated May 9, 2017 in European Application No. 17158227.3.

USPTO, Requirement for Restriction dated Dec. 2, 2016 in U.S. Appl. No. 15/056,358.

USPTO, Non-Final Rejection dated Feb. 27, 2017 in U.S. Appl. No. 15/056,358.

USPTO, Final Rejection dated Jun. 5, 2017 in U.S. Appl. No. 15/056,358.

USPTO, Advisory Action dated Aug. 16, 2017 in U.S. Appl. No. 15/056,358.

USPTO, Non-Final Rejection dated Sep. 25, 2017 in U.S. Appl. No. 15/056,358.

USPTO, Notice of Allowance dated Feb. 12, 2018 in U.S. Appl. No. 15/056,358.

European Patent Office, European Office Action dated Aug. 16, 2018 in Application No. 17158227.3-1103.

* cited by examiner

SYSTEMS FOR MODIFYING PRESSURE DIFFERENTIAL IN A CHEMICAL VAPOR PROCESS

CROSS-REFERENCE TO RELATED APPLICATIONS

This application is a divisional of, claims priority to and the benefit of, U.S. Ser. No. 15/056,358 filed Feb. 29, 2016 and entitled "METHODS FOR MODIFYING PRESSURE DIFFERENTIAL IN A CHEMICAL VAPOR PROCESS," which is hereby incorporated herein in its entirety for all purposes.

BACKGROUND

Chemical vapor infiltration and deposition (CVI/CVD) is a known process for making composite structures such as carbon/carbon brake disks. The CVI/CVD process typically used for making carbon/carbon brake disks is sometimes referred to as "conventional" or "isothermal" CVI/CVD. This process involves passing a reactant gas or gas mixture (e.g., methane, propane, etc.) around heated stack of porous structures (e.g., carbonized stack of porous materials) at absolute pressures as low as a few torr (~400 Pa or less). The gas diffuses into the stack of porous materials, driven by concentration gradients, and undergoes a CVD reaction such as thermal decomposition, hydrogen reduction, co-reduction, oxidation, carbidization, or nitridation to deposit a binding matrix.

During CVI/CVD, pores on the exterior of a stack of porous structures may become occluded. To resolve, one may remove the stack of porous structures from the process vessel and machine the stack of porous structures to open the pores. CVI/CVD may then be resumed.

SUMMARY

In various embodiments, a process is disclosed for densifying an annular porous structure comprising flowing a reactant gas into an inner diameter (ID) volume and through an ID surface of the annular porous structure, flowing the reactant gas through an outer diameter (OD) surface of the annular porous structure and into an OD volume, flowing the reactant gas from the OD volume through the OD surface of the annular porous structure, and flowing the reactant gas through an ID surface of the annular porous structure and into the ID volume.

In various embodiments, the process further comprises flowing the reactant gas into a preheater, wherein the preheater heats the reactant gas to a defined temperature before flowing into the ID volume. In various embodiments, the ID volume is defined by the annular porous structure and a graphite susceptor. In various embodiments, the reactant gas comprises at least one of methane, ethane, propane, cyclopentane, hydrogen, nitrogen, helium, argon, or an alkane. In various embodiments, the graphite susceptor is disposed within a furnace. In various embodiments, the annular porous structure comprises a carbon fiber. In various embodiments, the flowing the reactant gas into the ID volume cause an increase in pressure of the ID volume. In various embodiments, the increase in pressure of the ID volume creates a pressure differential between the ID volume and the OD volume. In various embodiments, the pressure differential drives the reactant gas to infiltrate a pore of the annular porous structure.

In various embodiments, the process further comprises adjusting a plug disposed in a lid of a graphite susceptor, the graphite susceptor supporting the annular porous structure. In various embodiments, the process further comprises energizing a reversing valve and unenergizing the reversing valve. In various embodiments, the unenergizing the reversing valve occurs in response to a command from a processor.

In various embodiments, the present disclosure provides an apparatus for densifying an annular porous structure comprising a furnace, a graphite susceptor disposed in the furnace, and a reversing valve, the reversing valve having a first port and a second port, wherein the first port is coupled to a first inlet/outlet in the furnace via a first line, and wherein the second port is coupled to a second inlet/outlet in the furnace via a second line. In various embodiments, the reversing valve has an energized state and an unenergized state. In various embodiments, in the energized state, the first port conveys a reactant gas to the furnace and into an inner diameter (ID) volume. In various embodiments, in the energized state, the second port exhausts the reactant gas through at least one of a second opening disposed in the graphite susceptor and a third opening disposed in the graphite susceptor. In various embodiments, in the unenergized state, the second port conveys the reactant gas to the furnace and into an outer diameter (OD) volume. In various embodiments, in the unenergized state, the first port exhausts reactant gas through a first opening disposed in the graphite susceptor.

In various embodiments, the furnace is at least one of gas heated or induction heated. In various embodiments, the graphite susceptor supports the annular porous structure. In various embodiments, the second opening is in communication with the OD volume and the third opening is in communication with the OD volume. In various embodiments, the first opening in communication with the ID volume. In various embodiments, the apparatus further comprises a spacer disposed in contact with the annular porous structure. In various embodiments, the apparatus further comprises a vacuum pump in fluid communication with the reversing valve. In various embodiments, the apparatus further comprises a reactant gas source in fluid communication with the reversing valve. In various embodiments, the apparatus further comprises a processor configured to toggle the reversing valve from the energized state to the unenergized state.

In various embodiments, the present disclosure provides an apparatus for densifying an annular porous structure comprising a graphite susceptor supporting the annular porous structure, wherein the annular porous structure defines an inner diameter (ID) volume and an outer diameter volume (OD), and wherein the graphite susceptor comprises a lid. In various embodiments, the apparatus further comprises a first plug disposed in a first opening of the lid, the first opening in fluid communication with the ID volume. In various embodiments, the apparatus further comprises a second plug disposed in a second opening of the lid, the second opening in fluid communication with the OD volume. In various embodiments, the apparatus further comprises a third plug disposed in a third opening of the lid, the third opening in fluid communication with the OD volume. In various embodiments, the apparatus further comprises a control arm configured to remove at least one of the first plug, the second plug, or the third plug.

In various embodiments, the graphite susceptor is disposed in a furnace. In various embodiments, the furnace is at least one of gas heated or induction heated. In various embodiments, the control arm is configured to insert the first plug into the first opening, the second plug into the second opening, and the third plug into the third opening. In various embodiments, the first plug, the second plug, and the third plug comprise graphite. In various embodiments, the control arm is controlled by a mechanical controller.

In various embodiments, the apparatus further comprises a spacer disposed in contact with the annular porous structure. In various embodiments, the apparatus further comprises a vacuum pump in fluid communication with the furnace. In various embodiments, the apparatus further comprises a reactant gas source in fluid communication with furnace, wherein the reactant gas comprises at least one of methane, ethane, propane, cyclopentane, hydrogen, nitrogen, helium, argon, or an alkane. In various embodiments, the annular porous structure comprises carbon fiber.

DETAILED DESCRIPTION

Figure 1:
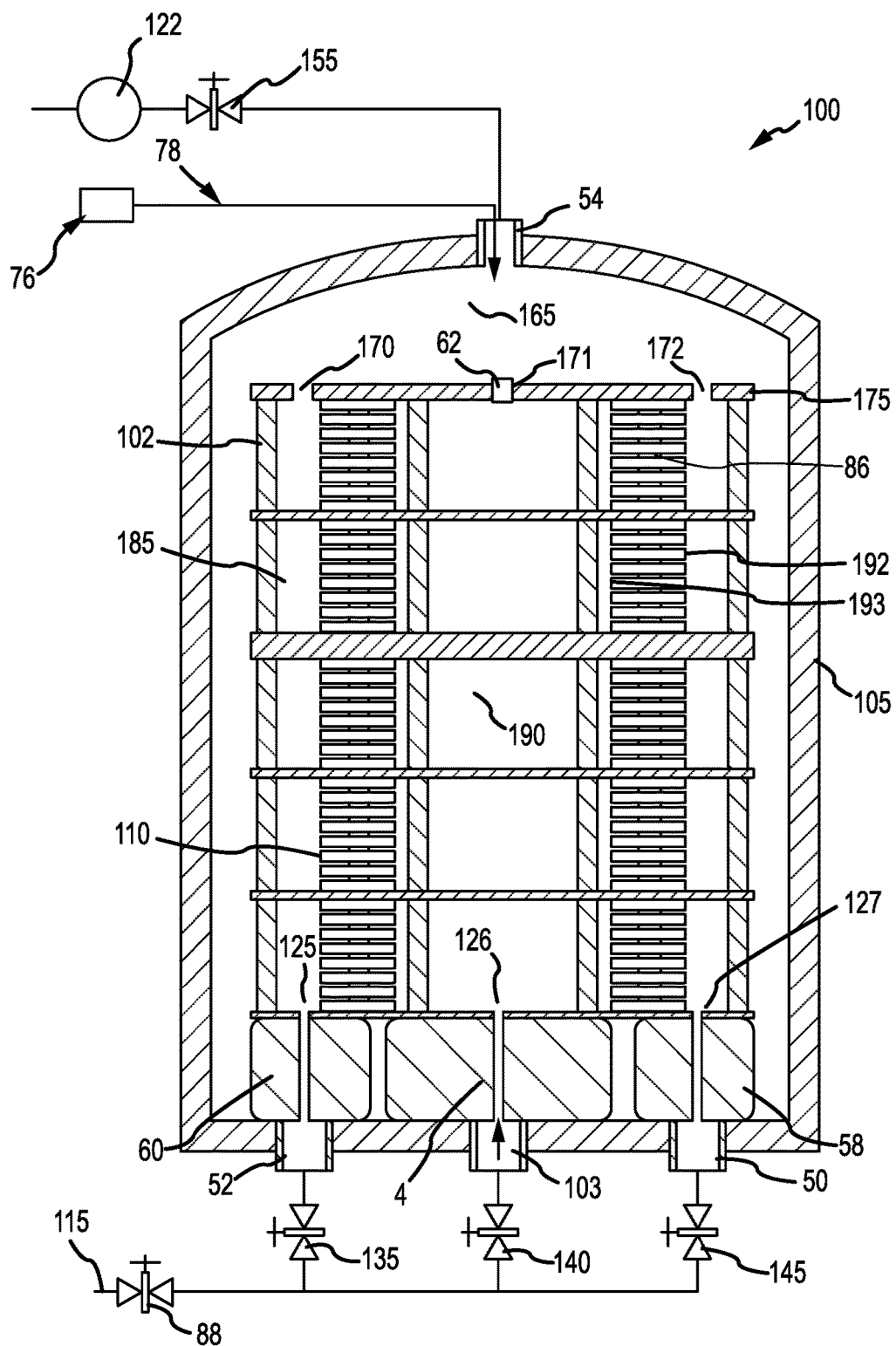
FIG. 1 illustrates a schematic view of a chemical vapor infiltration furnace configured for inner diameter (ID) gas feed, in accordance with various embodiments.

All ranges and ratio limits disclosed herein may be combined. It is to be understood that unless specifically stated otherwise, references to "a," "an," and/or "the" may include one or more than one and that reference to an item in the singular may also include the item in the plural.

The detailed description of exemplary embodiments herein makes reference to the accompanying drawings, which show exemplary embodiments by way of illustration and its best mode, and not of limitation. While these exemplary embodiments are described in sufficient detail to enable those skilled in the art to practice the disclosure, it should be understood that other embodiments may be realized and that logical, chemical and mechanical changes may be made without departing from the spirit and scope of the disclosure. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Carbon/carbon parts ("C/C") in the form of friction disks (also referred to as a carbon/carbon brake disks) are commonly used for aircraft brake disks, race car brakes, and clutch disks. Carbon/carbon brake disks are especially useful in these applications because of the superior high temperature characteristics of C/C material. In particular, the carbon/carbon material used in C/C parts is a good conductor of heat and is able to dissipate heat generated during braking away from the braking surfaces. Carbon/carbon material is also highly resistant to heat damage, and thus, is capable of sustaining friction between brake surfaces during severe braking without a significant reduction in the friction coefficient or mechanical failure. Furthermore, carbon/carbon brake disks are useful because they are relatively light weight, in particular in comparison to previous steel brakes.

One method of manufacturing C/C materials involves fabrication of a preform from an oxidized polyacrylonitrile (PAN) (also referred to as "OPF") or carbon fiber, followed by carbonization and chemical vapor infiltration (CVI) densification of the preform. As used herein, a preform may comprise any porous structure, and the terms preform, fibrous preform, and porous structure may be used interchangeably. The CVI/CVD process cycles are continued, in conjunction with machining the preform between infiltration cycles if desired, until the desired part density is achieved. In various embodiments, machining the surfaces of the preform may open surface porosity, thereby facilitating weight increases (i.e., density increases) in the preform during subsequent densification steps.

In general, C/C parts are produced using the OPF, carbonization, and CVI/CVD densification method are made in three successive manufacturing steps. First, a fibrous preform is made utilizing a variety of textile manufacturing techniques. Typically, the fibrous preform is made from OPF or carbon fiber. Although numerous techniques are known in the art for making fibrous preforms from OPF, a common technique involves stacking layers of OPF to superimpose the layers. The added layers may then be needled perpendicularly to the layers with barbed textile needles. The needling process generates a series of z-fibers through the fibrous preform that extend perpendicularly to the fibrous layers. The z-fibers are generated through the action of the needles pushing fibers from within the layer (x-y or in-plane) and reorienting them in the z-direction (through-thickness). Needling of the fibrous preform may be done as one or more layers are added to the stack or may be done after the entire stack is formed. The needles may also penetrate through only a portion of the preform or may penetrate through the entire preform. In addition, resins are sometimes added to the fibrous preform by either injecting the resin into the preform following construction or coating the fibers or layers prior to forming the fibrous preform. Fibrous preforms may also be made from pitch based carbon fiber tows and/or from rayon carbon fiber tows.

After the fibrous preform is made, it is carbonized to convert the OPF into carbon fibers in a process referred to herein as carbonization/graphitization. Typically, fibrous preforms are carbonized by placing the preforms in a furnace with an inert atmosphere. As is well-understood by those in the art, the heat of the furnace causes a chemical conversion which drives off the non-carbon chemicals from the preform. Carbonization/graphitization may be conducted in a vacuum or partial vacuum (e.g., at pressures of 1-15 torr) or in an inert atmosphere at a temperature in the range from about 1,400° C. to about 2,800° C. (2,552° F. to about 5,072° F.), and in various embodiments in the range from about 1,400° C. to about 2,500° C. (2,552° F. to about 4,532° F.), and in various embodiments in the range from about 1,400° C. to about 2,200° C. (2,552° F. to about 3,992° F.)(wherein the term about in this context only means +/−100° C.) for a period of time in the range of up to about 60 hours, and in various embodiments, in the range up to about 10 hours (wherein the term about in this context only means +/−2 hours). The resulting preform generally has the same fibrous structure as the fibrous preform before carbonizing. However, the OPF have been converted to 100% carbon or very near 100%, for example from 95% carbon to 99.9% carbon. The resulting preform may be referred to as having a fibrous network. In various embodiments, the preform may comprise any geometry.

After the preform has been carbonized, the preform is densified. The preform may be referred to as a "stack of porous structures" before and during densification. In general, densification involves filling the voids, or pores, of the fibrous preform with additional carbon material. This may be done using the same furnace used for carbonization or a different furnace. Typically, chemical vapor infiltration and deposition ("CVI/CVD") techniques are used to densify the fibrous preform with a carbon matrix. This commonly involves heating the furnace and the carbonized preforms, and flowing a reactant gas comprising, for example, hydrocarbon gases (e.g., at least one of methane, ethane, propane, butane, and/or the like, as described herein) into the furnace and around and through the fibrous preforms. The hydrocarbons may comprise alkanes, for example, straight chain, branched chain and/or cyclic alkanes, having from 1 to about 8 carbon atoms, and in various embodiments from 1 to about 6 carbon atoms, and in various embodiments from 1 to about 3 carbon atoms. Methane, ethane, propane, cyclopentane, or mixtures of two or more thereof may be used. The reactant gas may comprise one or more alkanes of 2 to about 8 carbon atoms, and in various embodiments from 2 to about 6 carbon atoms. Mixtures of one or more alkanes of 1 to about 8 carbon atoms with one or more alkenes of 2 to about 8 carbon atoms may be used. In various embodiments, the CVI/CVD process may include a temperature gradient. In various embodiments, the CVI/CVD process may include a pressure differential. As used herein, CVI/CVD may refer to chemical vapor infiltration or chemical vapor deposition. Accordingly, CVI/CVD may refer to chemical vapor infiltration or deposition.

CVI/CVD densification may be conducted in a vacuum or partial vacuum (e.g., at pressures of 1-15 torr (133 Pa to 1999 Pa) or in an inert atmosphere at a temperature in the range from about 900° C. to about 1100° C. (1,652° F. to about 2012° F.), and in various embodiments in the range of up to about 1,000° C. (1,832° F.) (wherein the term about in this context only means +/−100° C.) for a period of time in the range from about 150 hours to about 550 hours, and in various embodiments, in the range from about 300 hours to about 700 hours (wherein the term about in this context only means +/−24 hours). The number of hours used in a CVI/CVD process may be referred to as hours on gas (HOG).

As a result, carbon decomposes or pyrolyzes from the hydrocarbon reactant gases and is deposited on and within the preforms. Typically, the densification process is continued until the preform reaches a density in the range from 1.6 to 1.9 grams per cubic centimeter (g/cc), and in various embodiments, a density of approximately 1.75 g/cc. When the densification step is completed, the resulting C/C part has a carbon fiber structure with a carbon matrix infiltrating the fiber structure, thereby deriving the name "carbon/carbon."

The term "composite structure" may refer to a densified stack of porous structures. The composite structure may comprise a stack of porous structures with a solid residue or matrix dispersed throughout the stack of porous structures. The composite structure may comprise a carbonaceous stack of porous structures with a carbonaceous matrix dispersed in the stack of porous structures. This may be referred to as a carbon/carbon composite. The composite structure may comprise a ceramic stack of porous structures with a ceramic or oxide matrix dispersed in the stack of porous structures. The composite structure may comprise a mixed or hybrid composite structure such as a carbon stack of porous structures with a ceramic or oxide matrix dispersed in the stack of porous structures, a carbon stack of porous structures with a mix of carbon and ceramic or oxide matrix dispersed in the stack of porous structures, a ceramic stack of porous structures with a carbon matrix dispersed in the stack of porous structures, a ceramic stack of porous structures with a mix of carbon and ceramic or oxide matrix dispersed in the stack of porous structure, and the like. In various embodiments, the composite structure may comprise carbon, silicon, silicon carbide, silicon nitride, boron, boron carbide, aluminum nitride, titanium nitride, cubic zirconia, and $SiC_xN_y$, where x is a number in the range from about zero to about 1, and y is a number in the range from about zero to about 4/3.

The terms "higher order rough laminar structure," "rough laminar microstructure," "transitional microstructure," "smooth laminar microstructure," "transitional microstructure," "dark laminar" and "isotropic" may be used to describe the microstructure of a composite structure employing a carbon matrix dispersed in a stack of porous materials. The microstructure may be determined by use of polarized light microscopy. A carbon/carbon composite with a rough laminar structure may be characterized as having high optical activity and numerous irregular extinction crosses. A carbon/carbon composite with a smooth laminar structure may be characterized as having low optical activity and smooth extinction crosses. A carbon/carbon composite with little to no optical activity may be characterized as dark laminar or isotropic. These microstructures may be quantified in terms of their extinction angles.

Composite structures made according to various embodiments may be useful as carbon/carbon aircraft disk brakes, ceramic combustion and turbine components such as turbine engine hot section components, ceramic friction materials, ceramic heat sinks, and the like. The carbon/carbon disk brakes may be in the form of circular disks or disks.

As used herein, the term "stack of porous structures" may be interchangeable with "porous structures stack." A stack of porous structures may comprise one or more sub-stack of porous structures that are associated. For example, a stack of porous structures may comprise two sub-stack of porous structures coupled so that there is contact between each sub-stack of porous structures, such as in a "stack." A stack of porous structures may comprise three or four sub-stack of porous structures positioned so that at least two of the sub-stack of porous structures are in contact with each other. For example, a stack of porous structures system may comprise four sub-stacks stack of porous structures positioned in a stack formation.

The stack of porous structures may comprise a first surface, a second surface and at least one other surface connecting the first surface and the second surface. In various embodiments, and as used herein, any surface may be any shape such as, for example, at least one of rounded, sphere shaped, toroid shaped, or frustoconical.

In various embodiments, pressure differentials may also be used with thermal gradients. A pressure differential may be created when pressure on one surface of a stack of porous structures is different than the pressure at another surface of the stack of porous structures.

In conventional systems for CVI/CVD densification, soot and/or tar may coat surfaces of the stack of porous structures. Soot may refer to undesirable accumulations of carbon particles on the furnace equipment and/or stack of porous structures, and tar may refer to undesirable accumulations of large hydrocarbon molecules on the furnace equipment/stack of porous structures. The large hydrocarbon molecules may cause thick coatings on the surfaces of the stack of porous structures. Typically, accumulations of soot and/or tar form when the reactant gas stagnates for a period of time in an area or comes into contact with cooler furnace surfaces. Stagnation typically occurs in areas where the gas flow is blocked or where the gas flow is moving more slowly than the surrounding gas flow.

Accumulations of soot and tar can cause a number of problems which affect both the quality of the composite structures and the costs of manufacturing. Seal-coating is one typical problem that can result from soot and tar, although seal-coating can also be caused by other conditions that are described below. Seal-coating may occur when soot and/or tar deposit excess carbon early in the densification process on surfaces of the stack of porous structures. As the carbon accumulates on the surfaces of the stack of porous structures, the surface pores eventually become blocked (i.e., occluded), or sealed, thus preventing the flow of reactant gas from further permeating the stack of porous structures. As a result, densification of the interior region around the seal-coated surface prematurely stops, thereby potentially leaving interior porous defects in the finished carbon part (i.e., the densified preform).

To address the occlusion of pores of a stack of porous structures, conventionally, multiple densification steps were employed. Stated another way, a CVI/CVD process would be stopped, the furnace allowed to cool, and the stack of porous structures would be extracted and machined to open the pores. Then, the stack of porous structures would be placed into the furnace and the CVI/CVD process would commence again in a second CVI/CVD process step. The rearrangement and machining of the stack of porous structures between cycles (steps) is costly and time-consuming. Thus, in various embodiments, disclosed herein is a CVI/CVD process that may begin with a stack of porous structures that has previously not undergone a CVI/CVD process and achieve a commercially viable density of that stack of porous structures (e.g., reaches a density in the range from 1.6 g/cc to 1.9 g/cc), and in various embodiments, a density of approximately 1.75 g/cc) in a single cycle. In this regard, in various embodiments, stack of porous structures may be manufactured without use of multiple cycles.

In various embodiments, CVI/CVD processes are disclosed herein, where in-process modifications to a flow of reactant gas and/or exhaust gas are implemented in a single processing cycle. Modifying reactant gas flow direction reconfigures a pressure differential direction (e.g., switching high-pressure and low-pressure sides) during a CVI/CVD process cycle, thereby allowing a commercially-viable density to be achieved in a single processing cycle.

A number of different types of furnaces may be used for CVI/CVD processes. Typically, a furnace includes a cabinet that encloses a graphite susceptor. The graphite susceptor encloses one or more stacks of porous structures that are to undergo a CVI/CVD process.

In various embodiments, and with reference to FIG. 1, CVI/CVD apparatus 100 is illustrated. Spacers 86 are disposed between the porous structures 110, which may comprise one or more carbon fibers, effectively dividing the space within the graphite susceptor to create an inner diameter (ID) volume 190 and an outer diameter (OD) volume 185 and sealing an inner diameter (ID) volume 190 from OD volume 185. Spacers 86 may comprise solid rings. Spacers 86 may also comprise rings with voids configured to allow fluid communication between OD volume 185 and ID volume 190, in various embodiments. Where a solid ring is used for spacers 86, the pressure differential may develop more rapidly between OD volume 185 and ID volume 190 than where spacers 86 comprise a rings having voids. In various embodiments, spacers 86 comprise both solid rings and rings having voids. Spacers 86 may comprise carbon/carbon, graphite, and/or any other suitable material. Spacers 86 may also comprise a surface coating to prevent spacers 86 from adhering to porous structures 110. Porous structures 110 are annular and in that regard porous structures 110 comprise one or more annular porous structures. The ID volume 190 and OD volume 185 are not in fluid communication, except by way of the pores in the porous structures 110. The ID volume 190 is shown radially inward from an ID surface 193 on an inner diameter of porous structures 110. Therefore, ID volume 190 may be defined by the inside surface diameter of porous structures 110 and spacers 86. The OD volume 185 is shown radially outward from OD surface 192 of porous structures 110. Therefore, the OD volume 185 may be defined by the outside diameter of porous structures 110, spacers 86, and the inside surface of the graphite susceptor 102. The OD volume is shown radially outward from OD surface 192 of porous structures 110.

In various embodiments, the graphite susceptor 102 may be disposed within furnace 105 and may be induction heated by an induction coil or gas flame. Although induction heating is described herein, other methods of heating may also be used such as gas heating, resistance heating and microwave heating, any of which are considered to fall within the present disclosure.

To provide for the flow of reactant gas and to facilitate discharge of reactant gas exhaust, the furnace includes a number of inlets and outlets. Gas inlets 103, 52 and 50 are configured to allow reactant gas to flow into furnace 105. Outlet 54 is configured to allow reactant gas to flow out furnace 105. Valve 140 is configured to allow reactant gas to flow through gas inlet 103. Valve 145 is configured to allow reactant gas to flow through gas inlet 50. Valve 135 is configured to allow reactant gas to flow through gas inlet 52. Valve 155 is configured to allow reactant gas to flow out outlet 54. Vacuum pump 122 is in fluid communication with valve 155 and provides a suction source to evacuate furnace 105. Reactant gas source 115 may be in fluid communication with valve 88. Thus, actuation of valve 88 may operate to supply reactant gas to valves 135, 140, and 145.

In various embodiments, a preheater is included to heat the reactant gas before the reactant gas flows into ID volume 190 or OD volume 185. For example, a preheater may comprise a series of graphite plates with voids, heated by an induction coil and/or graphite susceptor 102. As the reactant gas passes through the preheater, it may be heated to a defined temperature. Typically, preheaters are sealed, such that an incoming reactant gas flowing from a gas inlet (e.g., gas inlets 52, 103, and 50) is received by the preheater and heated to the defined temperature. The heated reactant gas then enters graphite susceptor 102 by way of one or more openings (e.g., openings 125, 126, and 127) in the base of graphite susceptor 102. For example, preheaters 60, 4, and 58 may preheat reactant gas prior to entry of the reactant gas into ID volume 190 or OD volume 185.

Graphite susceptor 102 includes openings 125, 127 which open into OD volume 185. Graphite susceptor 102 includes opening 126, which opens into ID volume 190. Graphite lid 175 of graphite susceptor 102 includes three openings 170, 171, and 172. Plug 62 fills opening 171, and, referring to FIG. 2, plug 64 fills opening 170 and plug 66 fills opening 172. Plugs, such as plug 62, may comprise graphite or other suitable high temperature material. In various embodiments, plug 62 is a solid graphite weight that creates and maintains an airtight seal of a lid by force of gravity asserting significant downward pressure over opening 171. In various embodiments, the plug 62 is positioned above stack of porous structures 110, such that the plug 62 is wedged between a stack of porous structures 110 and an inner surface of graphite lid 175.

In various embodiments, a pressure differential may be created by feeding reactant gas into one volume, such as ID volume 190. Because ID volume 190 and OD volume 185 are fluidly connected only through porous structures 110, a pressure differential will be formed in the volume where reactant gas is fed, which in turn forces reactant gas through porous structures 110. To withstand a pressure differential, plugs 62, 64, and 66 may be used to seal graphite lid 175 and contain the reactant gas under pressure. In various embodiments, the seal between graphite lid 175 and porous structures 110 may ensure the generation of a pressure differential between ID volume 190 and OD volume 185.

In various embodiments, furnace 105 may be configured for an inner diameter (ID) feed. Reactant gas flows into the ID volume 190 by way of valve 140 and through opening 126. Plug 62 prevents reactant gas from escaping the ID volume 190. Increasing pressure within ID volume 190 pushes the reactant gas through the one or more pores of porous structures 110. In this regard, the pressure within ID volume 190 builds, to pressures of, for example, between 1 mmHg (133 Pa)-75 mmHg (9999 Pa), between 20 mmHg (2666 Pa)-50 mmHg (6666 Pa), and between 35 mmHg (4666 Pa) and 45 mmHg (5999 Pa). A portion of the reactant gas decomposes or pyrolyzes and is deposited within porous structures 110. Reactant gas flows in the direction of the outer diameter (OD) volume 185 by way of porous structures 110. In various embodiments, the reactant gas is drawn out the OD volume 185 through openings 170 and 172 and out the furnace 105 through outlet 54. Vacuum pump 122 provides suction through valve 155.

During a CVI/CVD process, the flow of reactant gas may be altered to change the pressure differential between the ID volume 190 and OD volume 185. For example, with reference to FIG. 2, mechanical controller 76 may control arm 78 to remove plug 62 from opening 171. Control arm 78 may place plug 64 in opening 170 and plug 66 in opening 172. In various embodiments, mechanical controller 76 is remotely controlled by an operator. In a remotely controlled configuration, mechanical controller 76 replicates or interprets the movements of an operator, who is positioned remotely at a safe distance from furnace 105. Control arm 78 may be controlled by way of instructions from one or more microcontrollers/microprocessors in mechanical controller 76. Sensors may be configured to provide information that may be used by the microcontroller/microprocessor to formulate instructions for controlling mechanical implement movements, for example.

In that regard, OD volume 185 may be sealed and ID volume 190 may become open through opening 171. Reactant gas may be fed through valves 135 and 145 into openings 125 and 127, thereby entering OD volume 185. Pressure may then build in OD volume 185, forcing the reactant gas to flow through OD surface 192 of porous structures 110. Reactant gas travels through the porous structures 110 and exits through ID surface 193, thus entering ID volume 190. After the reactant gas enters ID volume 190, it is expelled from ID volume 190 through an opening 171 in graphite lid 175. Vacuum pump 122 provides suction, through valve 155, which draws the reactant gas exhaust out furnace volume 165.

To alter a pressure differential, the reactant gas feed may be toggled between ID volume 190 and OD volume 185. When reactant gas is to be fed into OD volume 185, valves 135 and 145 may be opened, and valve 140 may be closed, allowing reactant gas to travel into OD volume 185. Valve 155 may then be actuated to exhaust the reactant gas. When reactant gas is to be fed into ID volume 190, valve 140 may be opened, and valve 135 and 145 may be closed, allowing reactant gas to travel into ID volume 190. Valve 155 may then be actuated to exhaust the reactant gas.

Reconfiguring the pressure differential and gas flow direction (i.e., changing which volume reactant gas enters and leaves) within graphite susceptor 102 may take place one or more times in the course of a CVI/CVD process, unlike in a typical CVI/CVD process where only one side of the stack of porous structures 110 is exposed to the higher side of a pressure differential. Reversal of the gas flow direction and pressure differential within a CVI/CVD process may offer potential advantages of a higher densification rate and increased density uniformity of the final carbon composite part.

Additional factors influence deposition uniformity including, for example, CVI/CVD process temperatures, graphite susceptor 102 volume pressures, reactant gas concentrations, geometry of furnace 105, geometry of graphite susceptor 102, HOG, etc. In various embodiments, changing the reactant feed between ID volume 190 and OD volume 185 or OD volume 185 and ID volume 190 may be performed once in a single cycle. Changing the flow of reactant gas (e.g., changing the feed from ID volume 190 to OD volume 185) may occur once during a CVI/CVD process, for example, after between about 50 to about 400 HOG, from about 100 to about 300 HOG, and from about 200 HOG to 250 HOG, where the term about in this context only means +/−10 HOG.

In various embodiments, the above reconfiguring/switching processes may also be implemented through inclusion of reversing valves within the furnace hardware configuration. This approach may provide a cost effective option that may also allow for retrofitting existing furnaces to achieve similar disclosed functionality.

This disclosure describes various embodiments relating to CVI/CVD processes as well as discussions relating to various hardware components and hardware configurations for carrying out the processes. One such hardware component is a valve, which is described herein as having a variety of functions relating to variously disclosed implementations, features, and functions. However, the inventive features disclosed herein are not solely reliant on the presence or lack thereof of one or more valves.

Figure 3:
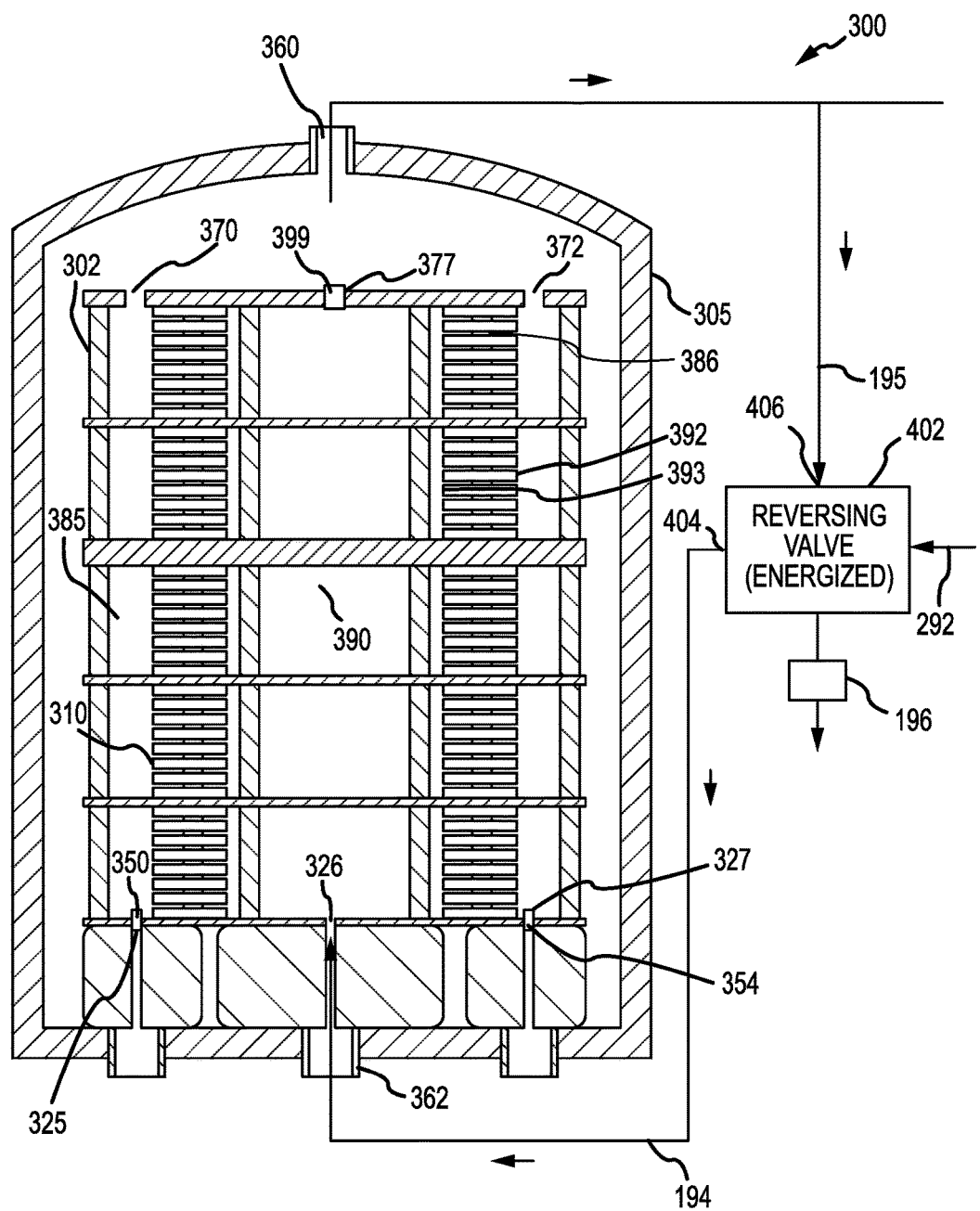
FIG. 3 illustrates a schematic view of a graphite susceptor configured for inner diameter (ID) gas feed using reversing valves in accordance with various embodiments.

Referring to FIG. 3, CVI/CVD apparatus 300 is shown. Graphite susceptor 302 may include a number of inlets/outlets (i.e., openings) for allowing gasses to flow into and out the graphite susceptor 302. Removable plugs may be used to configure the graphite susceptor 302. For example, plugs may be fitted into each of openings 377, 325, and 327. Control over graphite susceptor 302's configuration may be provided by such plugs, which allow the processes disclosed herein to be implemented through use of existing furnace configurations with minimal modification or retrofitting.

Line 195 may be attached to gas inlet/outlet 360. Line 195 may thus place reversing valve 402 into fluid communication with furnace 305. Line 194 may be attached to gas inlet/outlet 362. Line 194 may thus place reversing valve 402 into fluid communication with furnace 305. In various embodiments, line 195 and line 194 may comprise a pipe, conduit, or other suitable device for conveying fluids.

Figure 4:
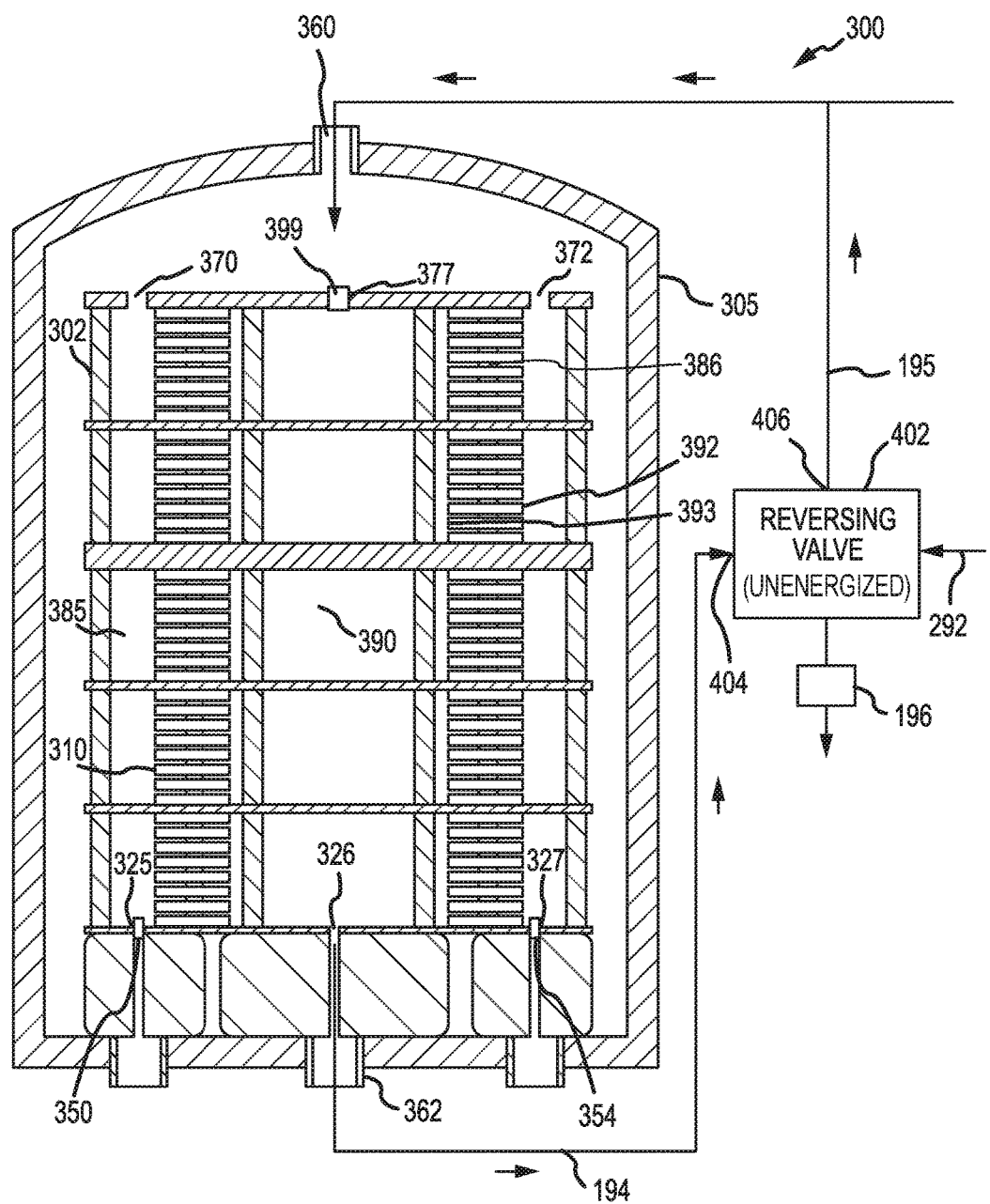
FIG. 4 illustrates a schematic view of a graphite susceptor configured for outer diameter (OD) gas feed using reversing valves in accordance with various embodiments.

With reference to FIG. 3 and FIG. 4, reversing valve 402 comprises four ports, two ports designated to function as gas inputs and two ports designated to function as gas outputs. Reversing valve 402 may exist in two states: energized or unenergized. Based on the state of the reversing valve 402 (e.g., energized or unenergized), the designated functions of two of the four ports may be reversed. Stated another way, in the energized state, two ports act as inlets and two act as outlets and in the unenergized state, one of the ports that act as an inlet in the energized state acts as an outlet and one of the ports that acts as an outlet in the energized state acts as an inlet. In particular, the flow in lines 195 and 194 may be reversed in response to energizing/unenergizing. Reversing valve 402 also includes an electronic actuation system to switch reactant gas flow direction in response to an instruction from at least one of an operator or a microcontroller (e.g., a processor). Reversing valve 402 reconfigures port designations in response to being switched to an energized state or an unenergized state, each state corresponding to a state of an electronic actuation system state of reversing valve 402.

In various embodiments, methods and configurations are described for configuring a reactant gas pressure differential among OD volume 385 and ID volume 390 during CVI/CVD processing. In various embodiments described herein, toggling reactant gas feed between ID volume 390 and OD volume 385 can be achieved by periodically energizing and un-energizing a reversing valve 402 in accordance with various embodiments.

The graphite susceptor 302's opening for reactant gas feed and the openings for reactant gas exhaust may be reversed, thereby allowing one to change the direction of the flow of reactant gas and switch the pressure differential with respect to the stack of porous structures 310. Spacers 386 are disposed within porous structures 310. The functions of the openings (i.e., inputs, outputs) are defined by the state of reversing valve 402. The reversing valve 402 may comprise a first port 404 and a second port 406, wherein the first port 404 is coupled to opening 326 in the graphite susceptor 302 via line 194. The second port 406 is coupled to second openings 370 and third opening 372 in graphite susceptor 302 via line 195. Plug 399 is disposed in opening 377, plug 350 is disposed in opening 325 and plug 354 is disposed in opening 327.

With reference to FIG. 3, in accordance with various embodiments, gas enters ID volume 390 by way of opening 326 in response to energizing reversing valve 402, which allows reactant gas to flow from line 194 that transports reactant gas from source 292 to be fed through opening 326. Thus, reversing valve 402 is in the energized state in FIG. 3. In various embodiments, the reactant gas flows into ID volume 390 and continues as pressure builds in ID volume 390. The pressure in ID volume 390 forces the reactant gas to flow through ID surface 393 of porous structures 310 and through OD surface 392 of porous structures 310. Reactant gas thus enters OD volume 385. Reactant gas may then be drawn through openings 370 and 372 and through inlet/outlet 360 into line 195. Reactant gas may then be drawn through reversing valve 402 towards a vacuum pump 196.

The reversing valve 402 may then unenergized, with reference to FIG. 4. In accordance with various embodiments, gas enters OD volume 385 by way of openings 370 and 372 in response to unenergizing reversing valve 402, which allows reactant gas to flow from line 195 that transports reactant gas from source 292 to be fed to openings 370 and 372 through inlet/outlet 360. In various embodiments, the reactant gas flows into OD volume 385 and continues as pressure builds in OD volume 385. The pressure in OD volume 385 forces the reactant gas to flow through OD surface 392 of porous structures 310 and through ID surface 393 of porous structures 310. Reactant gas thus enters ID volume 390. Reactant gas may then be drawn through opening 326 and through inlet/outlet 362 into line 194. Reactant gas may then be drawn through reversing valve 402 towards a vacuum pump 196.

Figure 2:
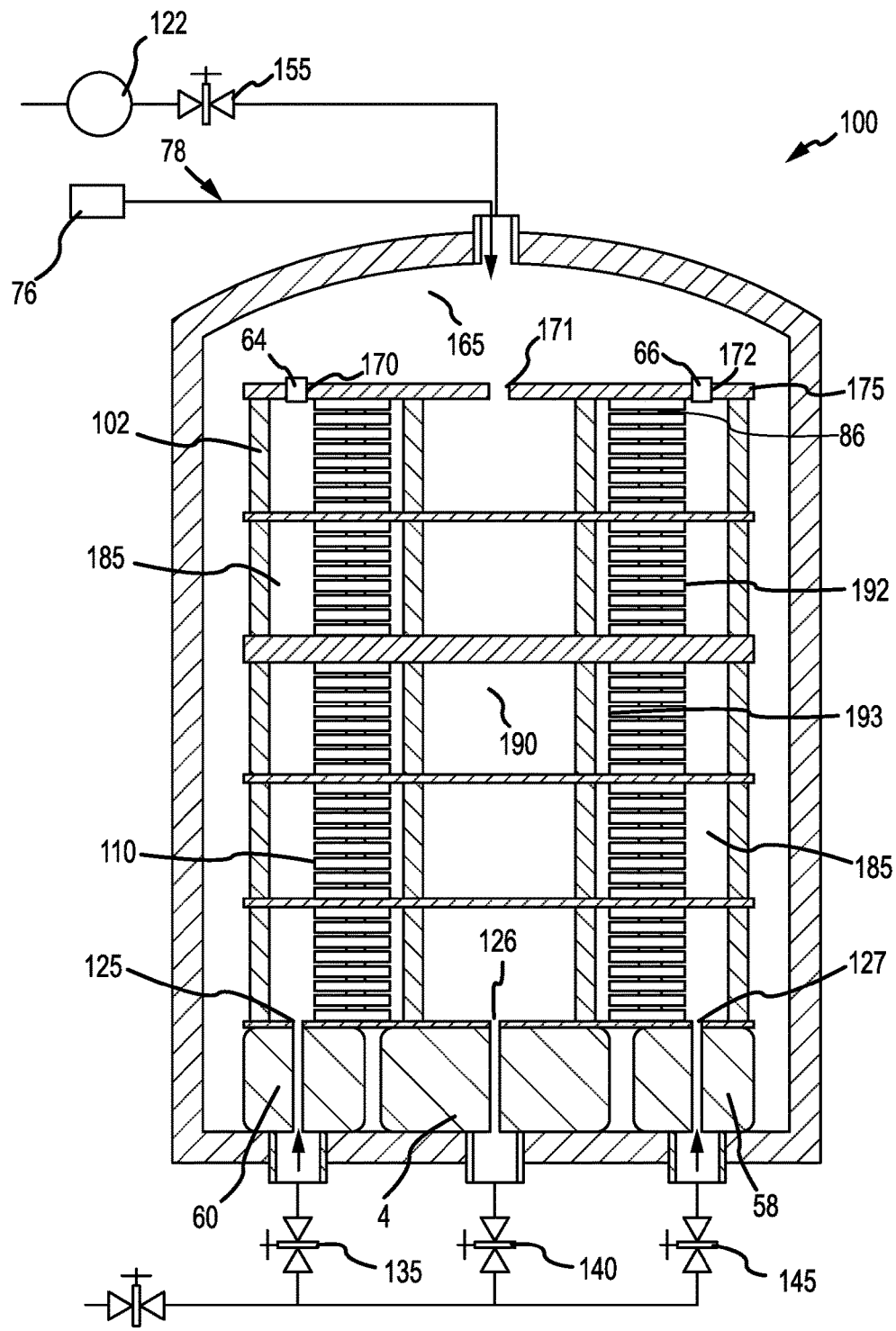
FIG. 2 illustrates a schematic view of a chemical vapor infiltration furnace configured for outer diameter (OD) gas feed in accordance with various embodiments.
Figure 5:
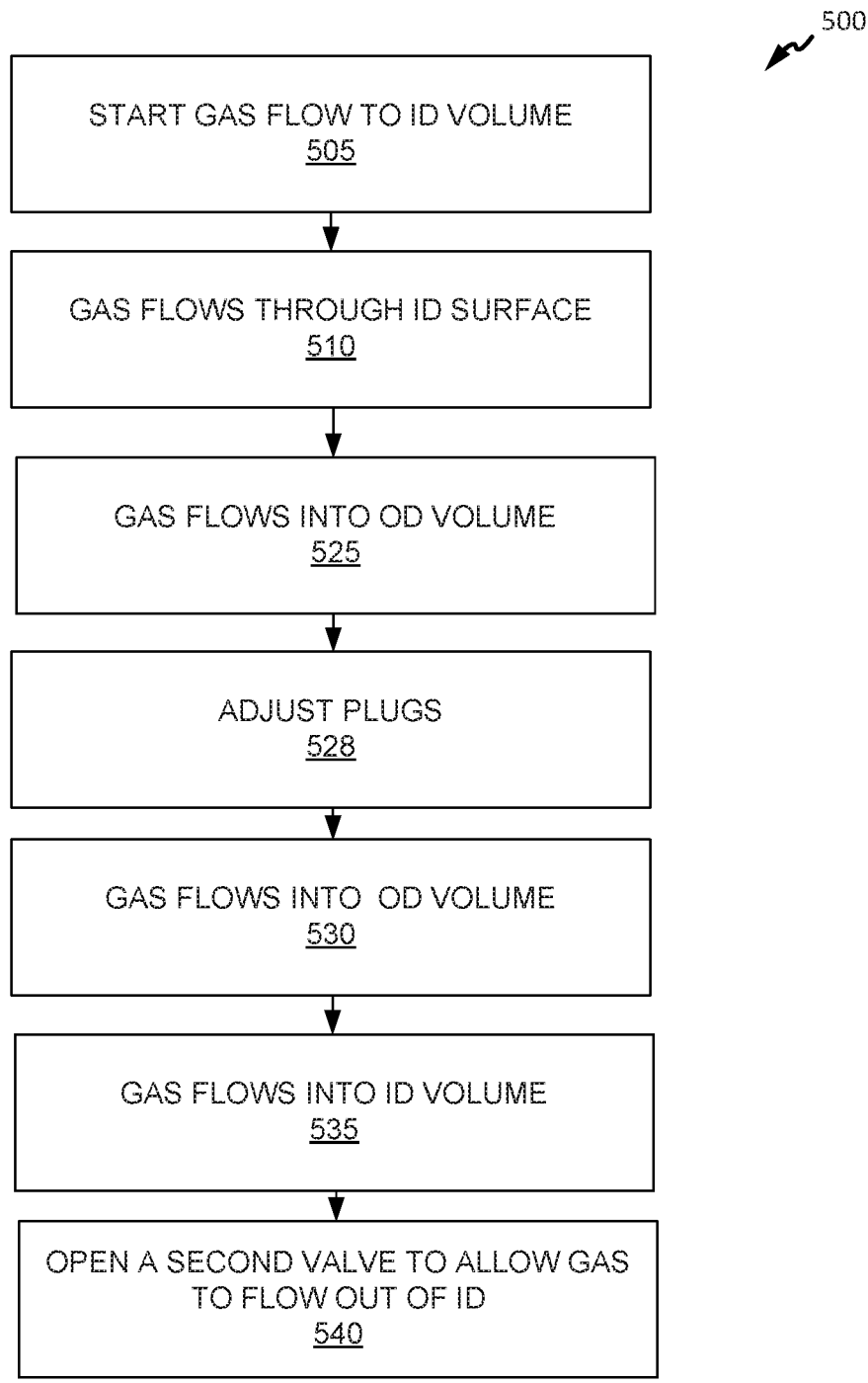
FIG. 5 illustrates a CVI/CVD process in accordance with various embodiments.

With reference to FIGS. 1, 2 and 5, method 500 is illustrated. A chemical vapor infiltration process for an inner diameter (ID) reactant gas feed is illustrated. One may open a first valve to start reactant gas to flow into ID volume 190 (Step 505). Reactant gas flows through ID surface 193 of the porous structures 110 (Step 510). Reactant gas flows into OD volume 185 (Step 525). After one or more HOG, the reactant gas flow may be altered. Plug 62 may be removed while plugs 64 and 66 may be set into place (Step 528). Reactant gas flows into the OD volume 185 (Step 530). As the reactant gas flows through porous structures 110, it flows into the ID volume 190 (Step 535). The reactant gas is then released from ID volume 190 as exhaust by way of opening 171 (Step 540).

Figure 6:
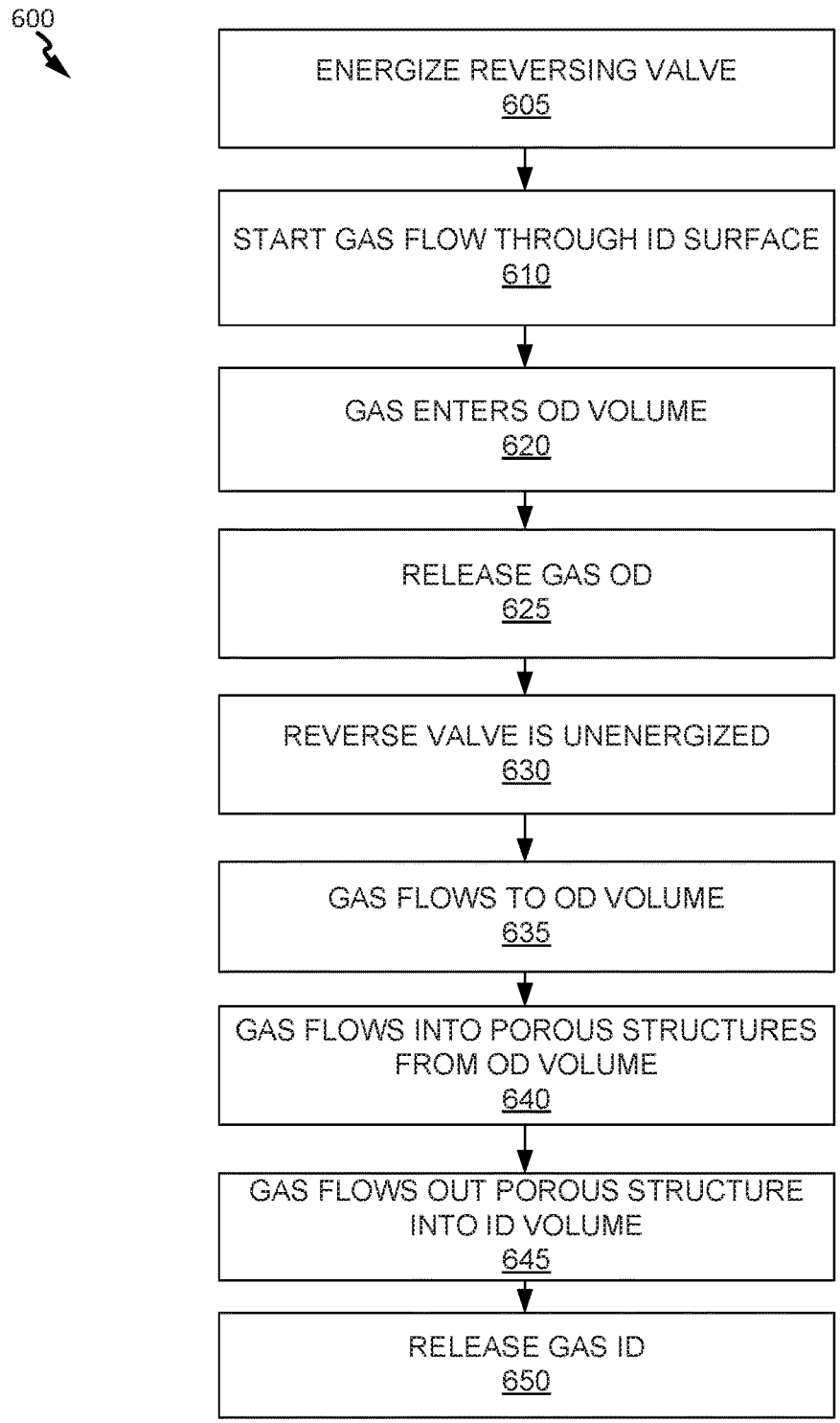
FIG. 6 illustrates a CVI/CVD process in accordance with various embodiments.

Referring to FIGS. 3, 4 and 6, method 600 is illustrated. A reversing valve may be energized (Step 605), causing line 194 to function as gas input line and line 195 to function as an exhaust line. Reactant gas enters the ID volume by way of opening 326 and flows through ID surface 393 (Step 610). The reactant gas then enters the OD volume 385 (Step 620). The reactant gas is released from OD volume by way of openings 370, 372 (Step 625). Reversing valve is then un-energized, causing line 195 to function as gas input line and line 194 to function as exhaust line (step 630). Reactant gas enters OD volume 385 by way of openings 370, 372, increasing the pressure in OD volume 385 (Step 635). The reactant gas flows from OD volume through the porous structures 310 in the direction of the ID volume 390 (Step 640). The reactant gas enters ID volume 390 through porous structures 310 (Step 645) and is released by way of opening 326 (Step 650).

During a CVI/CVD process, a furnace may typically operate at temperatures around 1025° C. (1877° F.), while heat treatment processes performed after the CVI/CVD process in the same furnace may operate as high as 2000° C. (3632° F.). As such, materials used in the manufacture of various furnace components shown in FIGS. 1 to 4, may be selected based on a material's ability to withstand extremely high temperatures. Alternatively, furnace components may be positioned away from areas in and around the furnace where the temperatures are highest.

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the invention. The scope of the invention is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. An apparatus for densifying an annular porous structure comprising:
    a furnace;
    a vacuum pump;
    a reactant gas source;
    a graphite susceptor disposed in the furnace, the graphite susceptor being configured to support a plurality of porous structures and a plurality of spacers disposed between adjacent porous structures, the graphite susceptor having a first opening, a second opening, a third opening, and a fourth opening, and each spacer comprising a solid ring;
    an inner diameter (ID) volume defined as being radially inward from a first inside surface of each porous structure in the plurality of porous structures and a second inside surface of each spacer in the plurality of spacers;
    an outer diameter (OD) volume defined as being radially outward from a first outer surface of each porous structure in the plurality of porous structures, a second outer surface of each spacer in the plurality of spacers, and an inner surface of the graphite susceptor, the OD volume and the ID volume being in fluid communication via the plurality of porous structures only;
    a reversing valve having a first port and a second port, wherein the first port is coupled to a first inlet/outlet in the furnace and the first opening in the graphite susceptor via a first line, and wherein the second port is coupled to a second inlet/outlet in the furnace and the second opening and the third opening in the graphite susceptor via a second line; and
    a plug disposed in the fourth opening;
    wherein the reversing valve has an energized state and an unenergized state;
    wherein the energized state comprises a first two-port state fluidly coupling the first port to the reactant gas source and fluidly coupling the second port to the vacuum pump and the unenergized state comprises a second two-port state fluidly coupling the first port to the vacuum pump and fluidly coupling the second port to the reactant gas source;
    wherein, in the energized state, the first port conveys a reactant gas to the furnace and into the first opening of the graphite susceptor and into the ID volume;
    wherein, in the energized state, the second port exhausts the reactant gas through at least one of the second opening disposed in the graphite susceptor and the third opening disposed in the graphite susceptor;
    wherein, in the unenergized state, the second port conveys the reactant gas to the furnace and through the second opening and the third opening of the graphite susceptor and into the OD volume;
    wherein, in the unenergized state, the first port exhausts reactant gas through the first opening disposed in the graphite susceptor.

2. The apparatus of claim 1, wherein the furnace is at least one of gas heated or induction heated.

3. The apparatus of claim 1, further comprising a processor configured to toggle the reversing valve from the energized state to the unenergized state.

* * * * *